(12) United States Patent
Groult et al.

(10) Patent No.: US 6,222,306 B1
(45) Date of Patent: Apr. 24, 2001

(54) ACTUATORS OF ACTIVE PIEZOELECTRIC OR ELECTROSTRICTIVE MATERIAL

(75) Inventors: Barthelemy Groult, Paris; Jean-Claude Charrier, Draveil, both of (FR)

(73) Assignee: SFIM Industries (FR)

( * ) Notice: Subject to any disclaimer, the term of this patent is extended or adjusted under 35 U.S.C. 154(b) by 0 days.

(21) Appl. No.: 09/457,105

(22) Filed: Dec. 7, 1999

(30) Foreign Application Priority Data

Dec. 7, 1998 (FR) .................................................. 98 15437

(51) Int. Cl.$^7$ ...................................................... H01L 41/08
(52) U.S. Cl. ........................... 310/337; 310/334; 310/369
(58) Field of Search .................................... 310/330–331, 310/334–337, 369

(56) References Cited

U.S. PATENT DOCUMENTS

| | | | |
|---|---|---|---|
| 3,142,035 | * 7/1964 | Harris | 310/337 |
| 3,177,382 | * 4/1965 | Green | 310/367 X |
| 4,025,805 | * 5/1977 | Coltman et al. | 310/337 X |
| 4,604,542 | * 8/1986 | Thompson | 310/334 X |
| 4,706,229 | * 11/1987 | Congdon | 310/369 X |
| 4,864,548 | * 9/1989 | Butler | 310/337 X |
| 5,001,382 | 3/1991 | Umeda et al. | |
| 6,041,888 | * 3/2000 | Tengham | 310/334 X |

FOREIGN PATENT DOCUMENTS 0516175  12/1992  (EP) .

* cited by examiner

*Primary Examiner*—Mark O. Budd
(74) *Attorney, Agent, or Firm*—Blakely Sokoloff Taylor & Zafman

(57) ABSTRACT

A piezoelectric or electrostrictive actuator, comprising a plurality of stages of piezoelectric or electrostrictive active blocks distributed so as to form a tubular structure, the polarization of the active blocks alternating from one stage to the next, separation elements separating the unit active blocks of any one stage in pairs, said elements being superposed on one another in the height direction of the structure, being suitable for sliding over one another, and being of stiffness greater than that of the unit active blocks, a separation element extending over the height of two stages of active blocks, the separation elements on either side of a given unit active block extending respectively through both stages on either side of said unit active block, electrode-forming means enabling voltages of alternating sign to be applied to the various stacks of active blocks, and wherein a separation element is constituted by two bonded-together slabs each belonging to a different stage, the slabs of any one stage alternating between slabs that are integral with a prestress structure which extends inside said stage, and slabs that are bonded to slabs of the preceding stage which are integral with the prestress structure of said other stage.

10 Claims, 6 Drawing Sheets

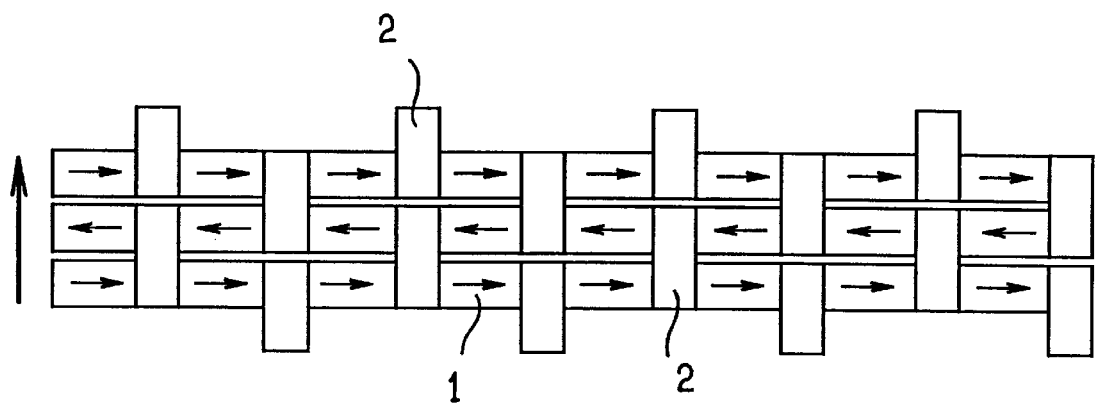
FIG_1
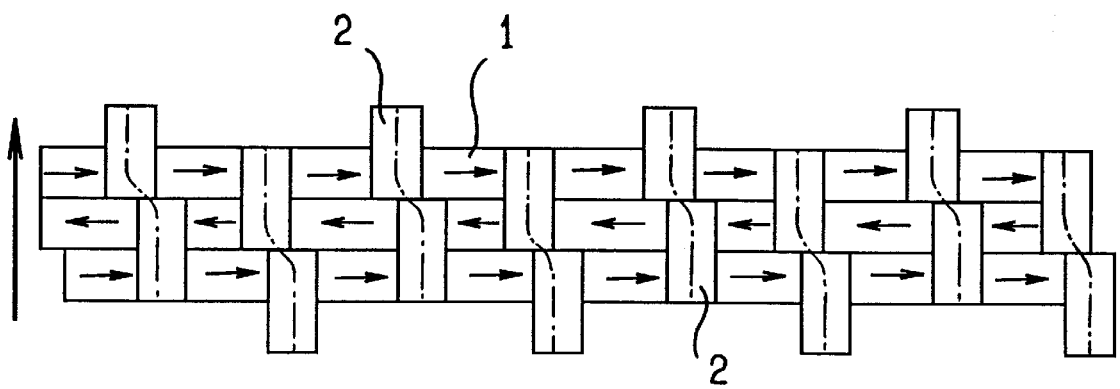
FIG_2

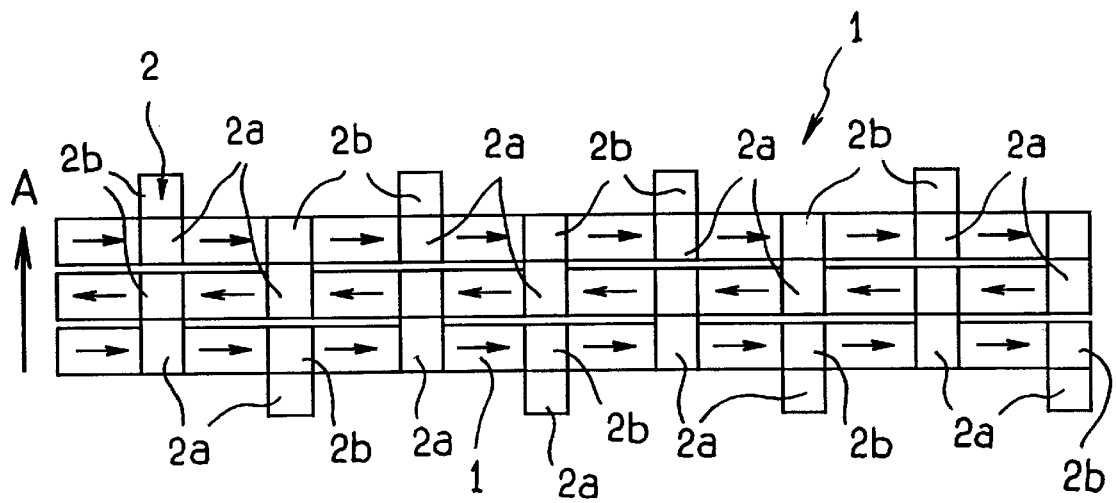
FIG_4
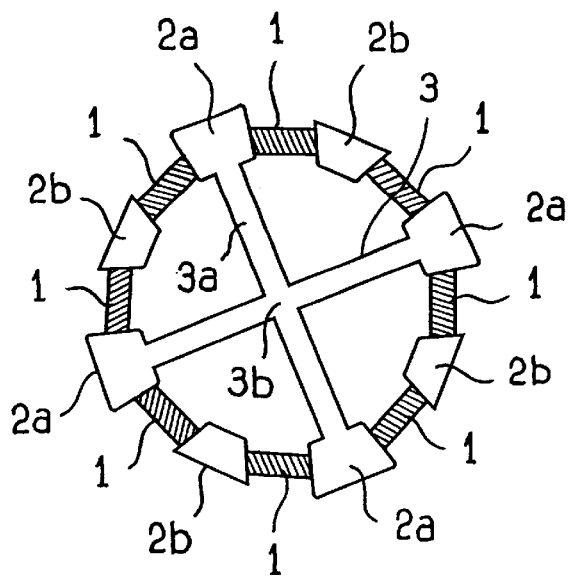
FIG_5

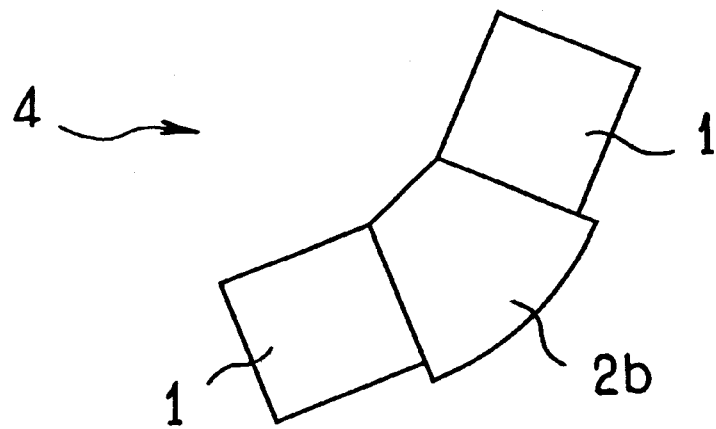
FIG_6a
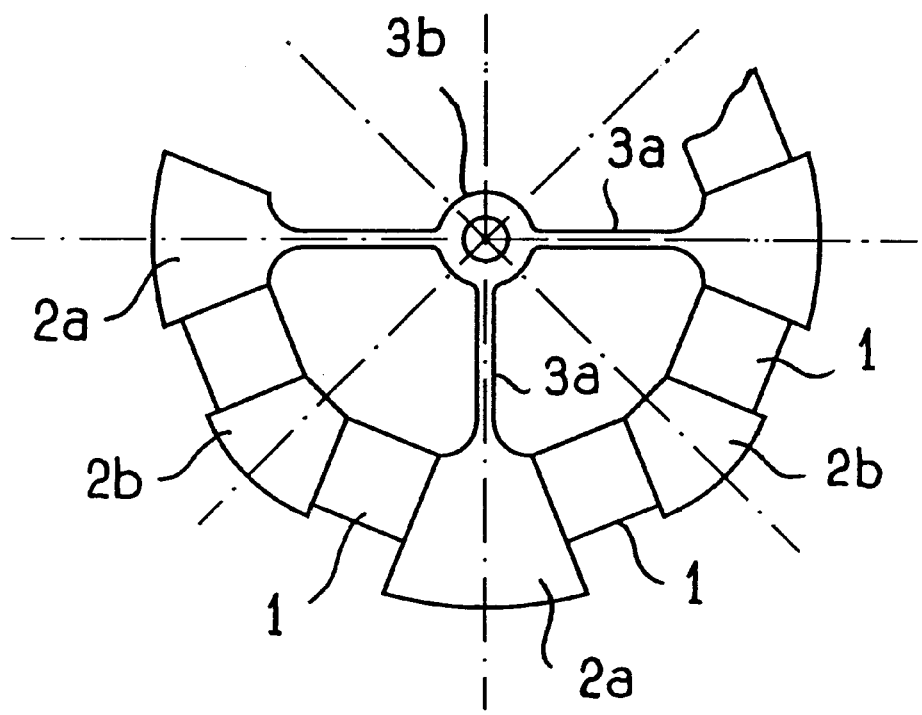
FIG_6b

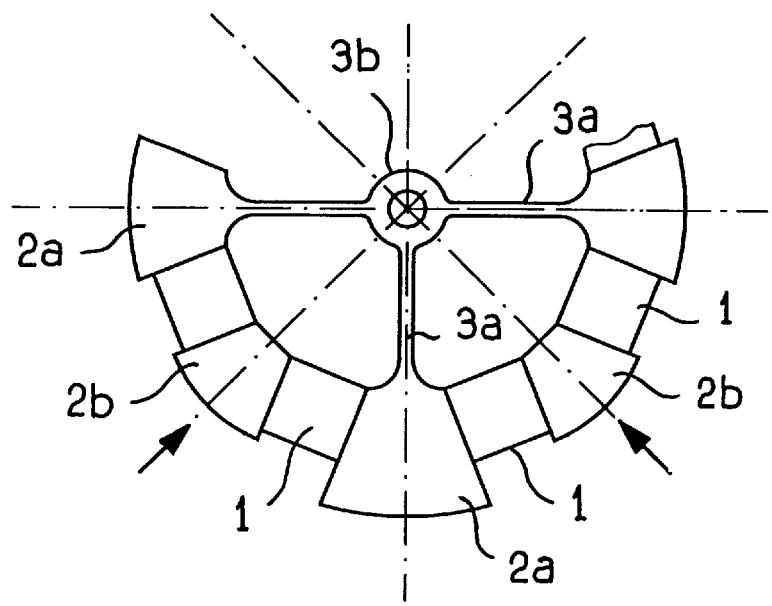
FIG_6c
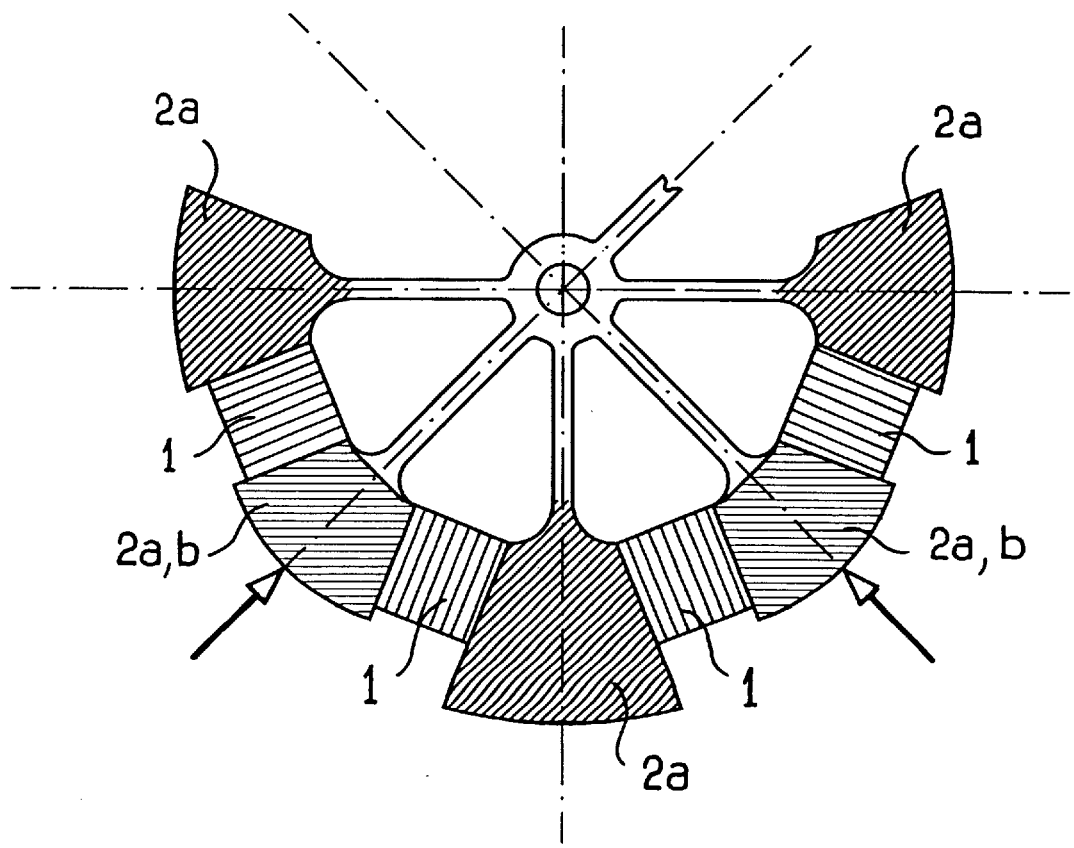
FIG_6d

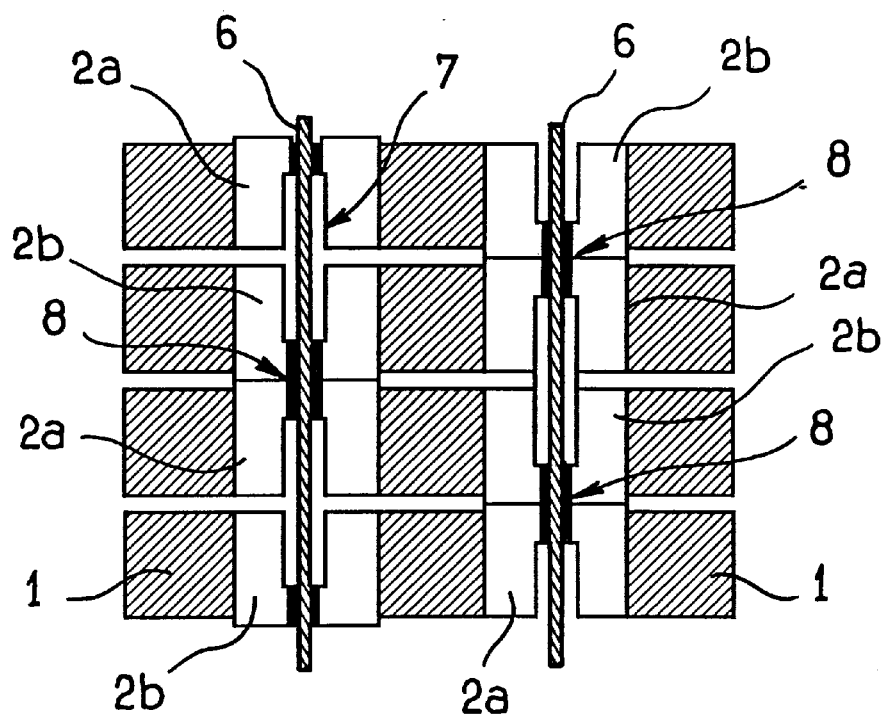
FIG_7a
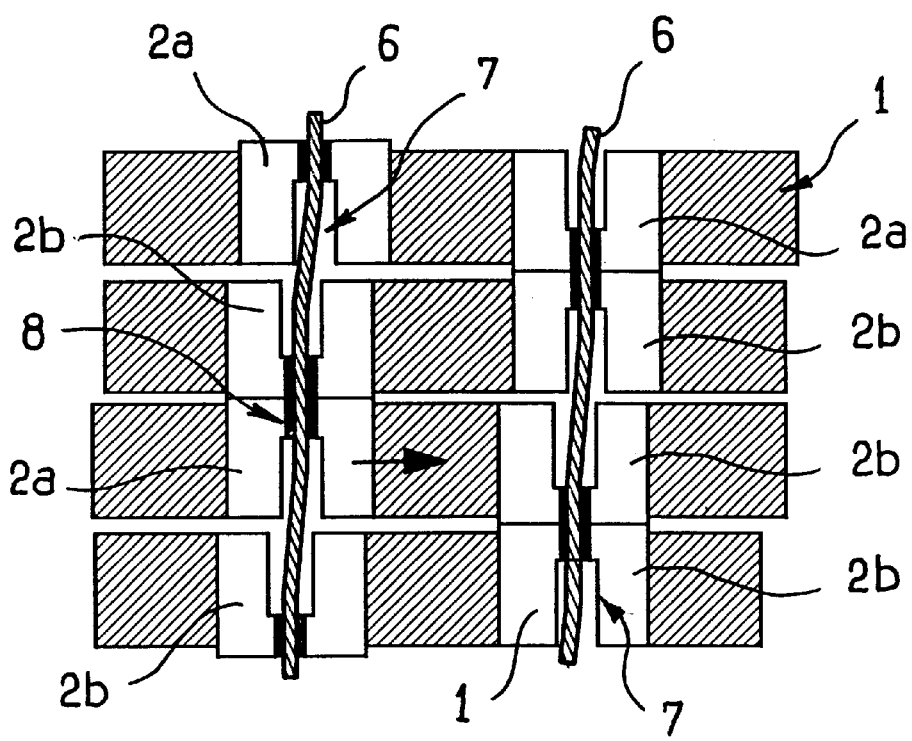
FIG_7b

ACTUATORS OF ACTIVE PIEZOELECTRIC OR ELECTROSTRICTIVE MATERIAL

The present invention relates to actuators of active piezoelectric or electrostrictive material.

It is advantageously applicable to making primary or secondary flight controls for aircraft.

BACKGROUND OF THE INVENTION

For various reasons (maintenance, pollution, fire risk, etc.), it is desirable to reduce the fraction of flight controls that are hydraulic in favor of controls that are electrical.

Unfortunately, the technological solution which consists in using electromagnetic motors in association with step-down gear box forming means gives rise to equipment of mass that is too high.

To mitigate the drawbacks of electromagnetic motors, proposals have already made to use motors based on piezoelectric or electrostrictive materials suitable for presenting high energy densities and capable of withstanding high stresses, for example vibration motors or amplifier actuators.

In this respect, reference can advantageously be made to:

"Actionneurs—Des matériaux piézo-électriques pour les commandes du futur" [Actuators—piezoelectric materials for controls of the future], Usine nouvelle, Oct. 31, 1996, No. 2568;

"Des commandes de vole piézo-électriques" [Piezoelectric flight controls], Air et Cosmos/Aviation International, No. 1602, Feb. 28, 1997; and "A new amplifier piezoelectric actuator for precise positioning and semi-passive damping", R. Le Letty, F. Claeyssen, G. Thomin—2nd Space Microdynamics and Accurate Control Symposium, May 13–16, 1997, Toulouse.

Nevertheless, the solutions shown in those publications are not satisfactory.

In particular, vibration motors cannot be used for primary controls since continuous operation would lead to the interface wearing too fast and to the most recent positions being maintained in the event of a power failure.

As for amplifier actuators, they require massive converter structures, thereby greatly reducing the initial advantage of lightness and energy density.

An object of the invention is to propose a piezoelectric or electrostrictive actuator structure which is rigid, lightweight, and capable of converting small unit piezoelectric or electrostrictive displacements into large displacements.

Although not to be taken into consideration when assessing the inventive step of the invention described below, since not yet published, it is appropriate to mention French patent application No. 97/12744 of Oct. 13, 1997 in the name of the Applicant company for a better understanding of the present invention.

That application describes an actuator which comprises a plurality of stacks of unit blocks of active piezoelectric or electrostrictive material, which blocks are juxtaposed in such a manner as to form a tubular structure constituted by superposed layers of blocks of active material having different polarization from one layer to another.

Separation strips which are distributed over the entire periphery of the structure and each of which extends over the full height thereof, separate successive unit blocks in the layers of the structure in pairs. Each separation strip is itself constituted by a plurality of separation elements superposed in the height direction of the structure. Each of those separation elements extends over two layers of active blocks and they are suitable for sliding over one another. They are of stiffness greater than that of the unit blocks of active material. By way of example, those separation strips are constituted by metal strips having slots distributed over their height, said slots separating successive separation elements.

As an illustration, a structure of that type is shown in developed form in FIG. 1. In this figure, the unit blocks of active material are referenced 1, and the separation elements are referenced 2. The arrows in the blocks 1 indicate their directions of polarization.

With such a structure, the actuator is subjected to twisting deformation when a voltage of alternating sign is applied to the metal separation strips.

This is shown in FIG. 2.

This twisting deformation can amount to 15°, or even more.

Making such an actuator requires the ceramics constituting the active blocks to be prestressed.

In the solution proposed by the above-mentioned patent application, the prestress is provided by rings of shape memory alloy that are electrically insulated from one another so as to avoid any short circuiting. Assembly then takes place in the manner shown in FIGS. 3a to 3c:

- alternating prestress rings BP and insulating washers R are stacked at low temperature in an outer tube T (FIG. 3a);
- split metal separation strips are stuck along the generator lines of an inner cylindrical core N;
- the core is inserted with its strips into the tube formed by the prestress washers;
- ceramic blocks 1 are inserted into the housings thus defined between the rings, the strips, and the core; and
- the assembly is heated so as to cause the prestress rings BP to change phase, so that said rings then exert force on the metal strips.

Nevertheless, such an implementation gives rise to several technical problems.

It is difficult to make compatible with conventional manufacturing tolerances that are conventional for ceramics. In particular, making ceramics with the tolerance that is required to ensure that the metal strips and the ceramic blocks are properly interfaced so as to have reliable and controllable prestresses available turns out to be difficult and gives rise to considerable extra cost.

In addition, the prestress rings give rise to extra weight which is penalizing for the actuator tube.

Also, working with materials that have shape memory gives rise to special problems associated with the hyperelastic behavior of such material and to the way in which their hyperelastic region moves as a function of temperature.

OBJECTS AND SUMMARY OF THE INVENTION

An object of the invention is to mitigate those drawbacks.

To this end, the invention provides a piezoelectric or electrostrictive actuator, comprising a plurality of stages of piezoelectric or electrostrictive active blocks distributed so as to form a tubular structure, the polarization of the active blocks alternating from one stage to the next, separation elements separating the unit active blocks of any one stage in pairs, said elements being superposed on one another in the height direction of the structure, being suitable for sliding over one another, and being of stiffness greater than that of the unit active blocks, a separation element extending over the height of two stages of active blocks, the separation elements on either side of a given unit active block extending respectively through both stages on either side of said unit active block, electrode-forming means enabling voltages of alternating sign to be applied to the various stacks of active blocks, and wherein a separation element is constituted by two bonded-together slabs each belonging to a different stage, the slabs of any one stage alternating between slabs that are integral with a prestress structure which extends inside said stage, and slabs that are bonded to slabs of the preceding stage which are integral with the prestress structure of said other stage.

The invention also provides a method of making such a piezoelectric or electrostrictive actuator, which method, in a first variant, comprises the following operations:

modules each comprising two active blocks on either side of a separation slab are installed between the separation slabs which are integral with the prestress structure of a stage;

a prestress force directed radially towards the inside of the stage is applied to those separation slabs of said stage that are not integral with the prestress structure;

the prestress structure of the following stage is positioned on the stage obtained in this way by placing the separation slabs which are integral with said prestress structure on the separation slabs of the preceding stage which are portions of the modules inserted between the separation slabs that are integral with the prestress structure of said stage;

the separation slabs superposed in this way are bonded together;

the prestress force exerted on the slabs of the preceding stage is removed; and assembly of the new stage is continued by installing modules, each comprising two active blocks on either side of a separation slab between the separation slabs that are integral with the prestress structure of the new stage.

In another variant:

modules each comprising two active blocks on either side of a separation slab are installed between the separation slabs which are integral with the prestress structure of a stage;

two stages obtained in this way are superposed while applying a prestress force which is directed radially towards the insides of said stages firstly on those separation slabs of one of the stages which are not integral with the prestress structure, and secondly on the separation slabs of the other stage which are superposed with said prestress separation slabs and which are integral with the prestress structure of said other stage; and the prestress separation slabs as superposed in this way are bonded together.

BRIEF DESCRIPTION OF THE DRAWINGS

Other characteristics and advantages of the invention appear further from the following description which is purely illustrative and non-limiting and which should be read with reference to the accompanying drawings, in which:

FIG. 1, described above, is a developed representation of an active structure of the kind described in FR 97/12774;

FIG. 2 is a developed representation for illustrating how the active structure of FIG. 1 operates in twisting;

FIG. 4 is a diagram similar to FIG. 1 showing an actuator structure constituting a possible embodiment of the present invention;

FIG. 5 is an end view of a stage of the FIG. 4 structure;

FIGS. 6a to 6d show how a structure of the type shown in FIGS. 4 to 5 is assembled; and FIGS. 7a to 7b show the disposition of the blades enabling voltage to be applied to the active blocks firstly when the structure is at rest and secondly when it is subjected to twisting.

MORE DETAILED DESCRIPTION

The actuator shown in FIG. 4 has a structure that is generally of the same type as that shown in FIGS. 1 and 2, and it comprises a plurality of active piezoelectric or electrostrictive blocks 1 that are distributed in the form of a stack having a plurality of layers, together with a plurality of separation elements 2 interposed between said active blocks 1. The blocks 1 are polarized in directions that alternate from one layer of the stack to the next.

Figure 3A:
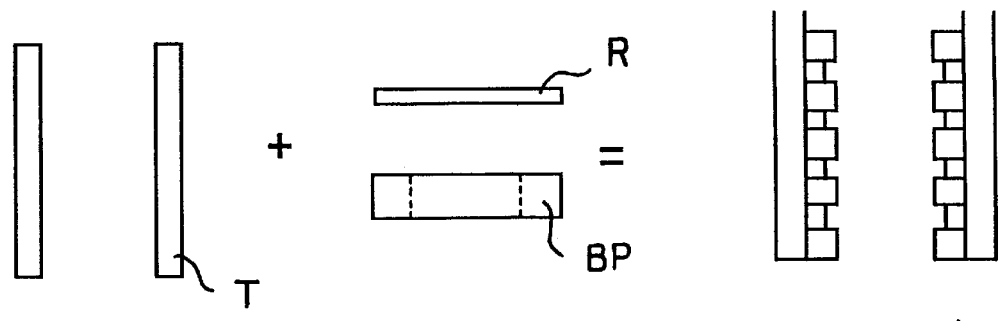
FIGS. 3a to 3c are diagrams showing various implementation steps proposed in FR 97/12774.
Figure 3B:
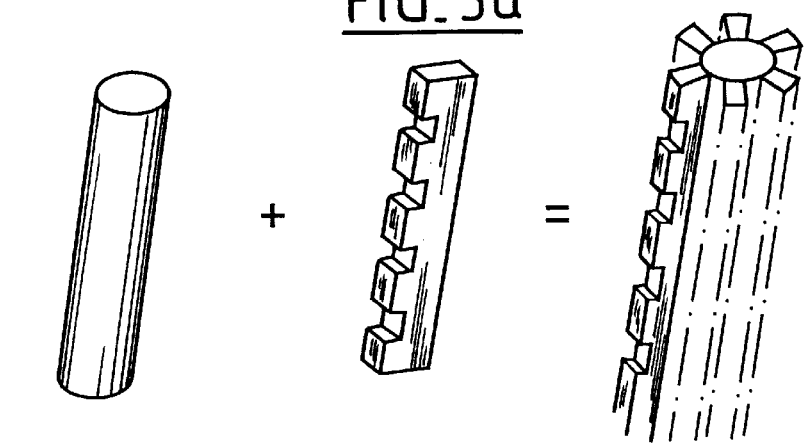
Figure 3C:
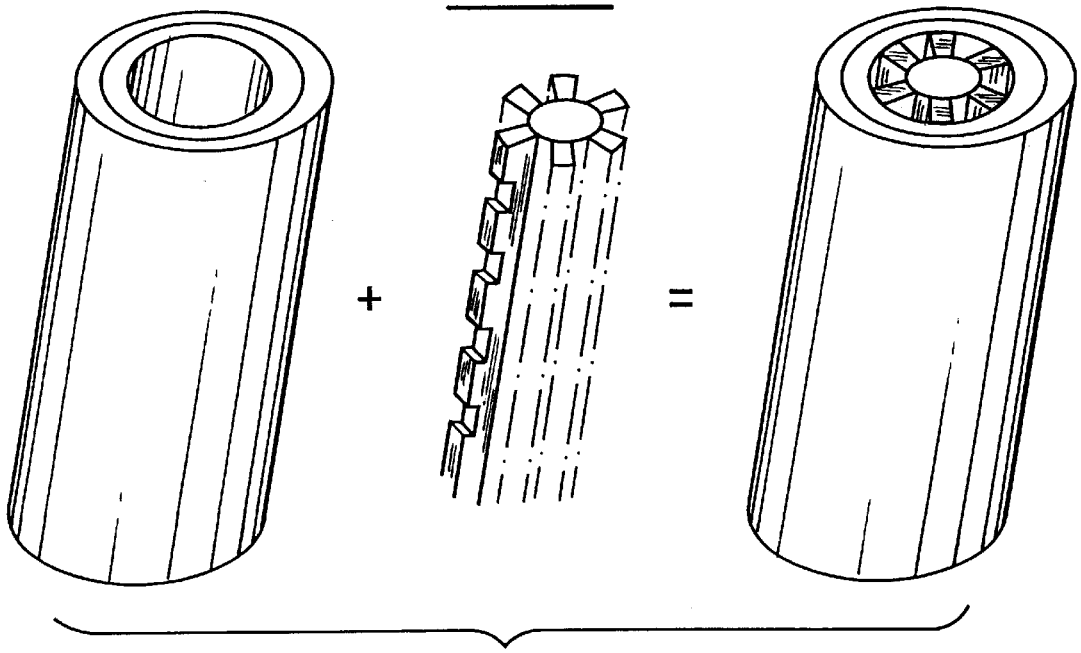

Nevertheless, unlike the embodiment proposed by the Applicant in prior application FR 97/12774 and described above with reference to FIGS. 1, 2, and 3a to 3c, successive separation elements 2 in the height direction of the structure are not single pieces.

Each separation element 2 is constituted by two slabs 2a and 2b of trapezoidal shape, which slabs are bonded together, each slab 2a, 2b having a height that corresponds to the height of a single layer of the stack of active blocks 1.

Within a given layer of the stack, slabs 2a alternate with slabs 2b. The slabs 2a in any one layer of the stack are rigidly interconnected by a structure 3 (FIG. 5) which extends inside the actuator and with which they are integrally formed. The slabs 2b are not interconnected.

The part constituted by the structure 3 and the slabs 2a is designed to apply prestress to the ceramics which constitute the active blocks 1.

As shown in FIG. 5, the prestress structure 3 is advantageously constituted by a plurality of arms 3a extending radially in a cross configuration (for a tubular actuator having eight active blocks 1 per stage)—and more generally in a star configuration—between a central element 3b and the slabs 2a.

The central element 3b is preferably annular in shape.

The tubular stack corresponding to the structure shown in FIG. 5 is assembled as follows.

Initially, modules 4 each constituted by two ceramic blocks 1 and a steel trapezoidal slab 2b are assembled together with the two blocks 1 being disposed on either side of the slab 2b (FIG. 6a).

Then, the resulting modules 4 are positioned between the trapezoidal slabs 2a terminating the arms 3a of the cross-shaped link structure.

A prestress force is applied to the trapezoidal slabs 2b, which force is directed radially towards the inside of the tubular structure (FIG. 6b).

Thereafter, the resulting stage has a new prestress part positioned thereon (slabs 2a interconnected by a link structure 3) by placing the slabs 2a of this prestress part on the slabs 2b of the preceding stage. For an actuator that has eight active blocks 1 per stage and cross-shaped prestress parts, the prestress parts are turned through 45° from one stage to the next (FIG. 6c).

The slabs 2a of this new stage are bonded to the slabs 2b of the preceding stage (shaded zones in FIG. 6d).

The staggered prestress exerted on the slabs 2b is then released. It is then possible to continue by assembling a new stage by inserting modules 4 constituted by two active blocks disposed on either side of a separation slab 2b between the slabs 2a of the new stage.

Once the various stages have been assembled, metal blades 6 (FIGS. 7a, 7b) are bonded to the metal slabs 2a, 2b so as to enable each stage of the actuator to be powered.

The blades 6 are received in notches 7 formed in the separation slabs 2a, 2b. These notches 7 leave clearance for these blades 6 to move when the structure is subjected to twisting, and are of width and depth elected for this purpose. The bonding zones, referenced 8, of said blades 6 are distributed once every pair of slabs 2a, 2b with the non-bonded length between two such zones being as long as possible. These bonding zones 8 alternate in the vertical direction of the actuator from one stack of separation slabs to the next.

As will be understood, such an assembly makes it possible to avoid the tolerance dispersion problems that are encountered with assemblies of the type shown in FR 97/12774.

In particular, a certain amount of dimension tolerance can be accepted on the elements constituting the modules 4. In particular, radial or tangential displacement of the blocks 1 and of the slabs 2b relative to a theoretical nominal dimension can be tolerated.

Furthermore, the prestress structure extends inside the stages of the actuator and presents smaller mass than do the prestress rings.

Also, the proposed solution makes it possible to avoid using a shape memory alloy for forming the prestress structure.

Other variants of the method of making the structure that is proposed by the invention can be envisaged.

In particular, two stages obtained by assembling modules 4 on prestress structures can be superposed while applying a prestress force which is directed radially towards the insides of said stages both on those separation slabs of one of the stages which are not integral with the prestress structure, and also on the separation slabs of the other stage which are superposed on said prestress separation slabs and which are integral with the prestress structure of said other stage. The prestress separation slabs that have been superposed in this way are then bonded together.

An example of possible dimensions for a stage of an actuator structure as proposed by the invention is as follows:
  inside diameter of the central annular element 3b of the prestress cross: 6 mm;
  inside diameter of the ceramic ring: 15 mm;
  outside diameter of the ceramic ring: 22 mm;
  height h of a ring: 2.3 mm;
  height h of a cross: 2.1 mm;
  width of the arms of the cross: 1.2 mm;
  height of a ceramic block: 2 mm;
  operating clearance between stages: 0.3 mm;
  length (active direction) of a ceramic block: 4.5 mm; and
  width of a ceramic block: 3.6 mm.

The number of ceramic blocks per stage is advantageously eight, with the actuator having 364 stages.

The link structures 3 and the slabs 2a, 2b are made of steel having high mechanical characteristics.

The ceramics used are either solid ceramics, or else multilayer blocks such as PZ26 ceramics having a Young's modulus of 50,000 MPa and having a deformation ratio of $\pm 10^{-3}$, following behavior that is practically linear. The nominal electric field is [−1500 volts/mm; +1500 volts/mm].

The blades used for powering the metal structures are phynox blades that are 4 mm thick and 2 mm wide.

What is claimed is:

1. A piezoelectric or electrostrictive actuator, comprising a plurality of stages of piezoelectric or electrostrictive active blocks distributed so as to form a tubular structure, the polarization of the active blocks alternating from one stage to the next, separation elements separating the unit active blocks of any one stage in pairs, said elements being superposed on one another in the height direction of the structure, being suitable for sliding over one another, and being of stiffness greater than that of the unit active blocks, a separation element extending over the height of two stages of active blocks, the separation elements on either side of a given unit active block extending respectively through both stages on either side of said unit active block, electrode-forming means enabling voltages of alternating sign to be applied to the various stacks of active blocks, and wherein a separation element is constituted by two bonded-together slabs each belonging to a different stage, the slabs of any one stage alternating between slabs that are integral with a prestress structure which extends inside said stage, and slabs that are bonded to slabs of the preceding stage which are integral with the prestress structure of said other stage.

2. An actuator according to claim 1, wherein the prestress structure of a stage is generally star-shaped.

3. An actuator according to claim 2, wherein the number of active blocks per stage is eight, and wherein the prestress structure of any one stage is generally cross-shaped.

4. An actuator according to claim 1, wherein a separation slab is generally trapezoidal in shape.

5. An actuator according to claim 1, wherein the separation slabs are made of metal.

6. An actuator according to claim 5, wherein blades which extend in the height direction of the structure are bonded to the separation slabs to enable voltage to be applied to the active blocks.

7. An actuator according to claim 6, wherein the blades extend in notches leaving them with clearance when the tubular structure is subjected to twisting deformation.

8. An actuator according to claim 6, wherein the bonding zones are distributed substantially every other slab in the height direction of a stack of separation slabs.

9. A method of making a piezoelectric or electrostrictive actuator according to claim 1, comprising the following various operations:
  modules each comprising two active blocks on either side of a separation slab are installed between the separation slabs which are integral with the prestress structure of a stage;
  a prestress force directed radially towards the inside of the stage is applied to those separation slabs of said stage that are not integral with the prestress structure;
  the prestress structure of the following stage is positioned on the stage obtained in this way by placing the separation slabs which are integral with said prestress structure on the separation slabs of the preceding stage which are portions of the modules inserted between the separation slabs that are integral with the prestress structure of said stage;
  the separation slabs superposed in this way are bonded together;
  the prestress force exerted on the slabs of the preceding stage is removed; and assembly of the new stage is continued by installing modules, each comprising two active blocks on either side of a separation slab between the separation slabs that are integral with the prestress structure of the new stage.

10. A method of making a piezoelectric or electrostrictive actuator according to claim 1, comprising the following various operations:

modules each comprising two active blocks on either side of a separation slab are installed between the separation slabs which are integral with the prestress structure of a stage;

two stages obtained in this way are superposed while applying a prestress force which is directed radially towards the insides of said stages firstly on those separation slabs of one of the stages which are not integral with the prestress structure, and secondly on the separation slabs of the other stage which are superposed with said prestress separation slabs and which are integral with the prestress structure of said other stage; and the prestress separation slabs as superposed in this way are bonded together.

* * * * *